(12) United States Patent
Roy et al.

(10) Patent No.: US 10,510,547 B2
(45) Date of Patent: Dec. 17, 2019

(54) METAL AND METAL-DERIVED FILMS

(71) Applicant: Applied Materials, Inc., Santa Clara, CA (US)

(72) Inventors: Susmit Singha Roy, Mountain View, CA (US); Yingli Rao, Palo Alto, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/120,800

(22) Filed: Sep. 4, 2018

(65) Prior Publication Data

US 2019/0080915 A1    Mar. 14, 2019

Related U.S. Application Data

(60) Provisional application No. 62/557,857, filed on Sep. 13, 2017.

(51) Int. Cl.
| | | |
|---|---|---|
| H01L 21/285 | (2006.01) | |
| H01L 21/321 | (2006.01) | |
| C23C 16/34 | (2006.01) | |
| C23C 16/06 | (2006.01) | |
| H01L 27/115 | (2017.01) | |

(52) U.S. Cl.
CPC ........ *H01L 21/28568* (2013.01); *C23C 16/06* (2013.01); *C23C 16/34* (2013.01); *H01L 21/321* (2013.01); *H01L 27/115* (2013.01)

(58) Field of Classification Search
None
See application file for complete search history.

(56) References Cited

U.S. PATENT DOCUMENTS

| | | | |
|---|---|---|---|
| 6,040,021 A | 3/2000 | Miyamoto | |
| 6,589,887 B1 | 7/2003 | Dalton et al. | |
| 6,638,810 B2 | 10/2003 | Bakli et al. | |
| 6,743,473 B1 | 6/2004 | Parkhe et al. | |
| 7,094,685 B2 * | 8/2006 | Yang ................. | C23C 16/06 |
| | | | 438/627 |
| 8,354,660 B2 * | 1/2013 | Sekar ................ | H01L 45/145 |
| | | | 257/290 |
| 8,841,648 B2 * | 9/2014 | Chen ................. | G11C 11/5685 |
| | | | 257/2 |
| 2003/0082296 A1 | 5/2003 | Elers et al. | |
| 2004/0013803 A1 | 1/2004 | Chung et al. | |
| 2009/0230555 A1 * | 9/2009 | Chapple-Sokol ........ | |
| | | | H01L 23/53223 |
| | | | 257/751 |
| 2012/0091419 A1 * | 4/2012 | Chen ................. | H01L 45/08 |
| | | | 257/4 |
| 2012/0252207 A1 | 10/2012 | Lei et al. | |

(Continued)

*Primary Examiner* — Asok K Sarkar
(74) *Attorney, Agent, or Firm* — Patterson + Sheridan, LLP

(57) ABSTRACT

Embodiments described herein relate to methods and materials for fabricating semiconductor device structures. In one example, a metal film stack includes a plurality of metal containing films and a plurality of metal derived films arranged in an alternating manner. In another example, a metal film stack includes a plurality of metal containing films which are modified into metal derived films. In certain embodiments, the metal film stacks are used in oxide/metal/oxide/metal (OMOM) structures for memory devices.

20 Claims, 4 Drawing Sheets

(56) References Cited

U.S. PATENT DOCUMENTS

| | | | |
|---|---|---|---|
| 2014/0001576 A1* | 1/2014 | Gandikota | H01L 21/28061 |
| | | | 257/412 |
| 2014/0295673 A1* | 10/2014 | Shero | H01L 21/02211 |
| | | | 438/763 |
| 2017/0186694 A1* | 6/2017 | Cheng | H01L 23/53238 |
| 2018/0331118 A1* | 11/2018 | Amano | H01L 23/485 |
| 2019/0033504 A1* | 1/2019 | Miyata | B32B 7/02 |
| 2019/0081105 A1* | 3/2019 | Park | H01L 27/0688 |
| 2019/0259946 A1* | 8/2019 | Makala | H01L 27/2427 |

* cited by examiner

METAL AND METAL-DERIVED FILMS

CROSS-REFERENCE TO RELATED APPLICATIONS

This application claims benefit to U.S. Provisional Patent Application No. 62/557,857, filed Sep. 13, 2017, the entirety of which is herein incorporated by reference.

BACKGROUND

Field

Embodiments of the present disclosure generally relate to methods and materials for forming advanced semiconductor devices.

Description of the Related Art

The designs of memory and other semiconductor devices have undergone rapid development in recent years. Current memory devices are able to retain stored data for a very long period of time without applying a voltage thereto, and the reading rate of such memory devices is relatively high. It is relatively easy to erase stored data and rewrite data into the memory devices. Thus, memory devices have been widely used in micro-computers, and automatic control systems, etc. To increase the bit density and reduce the cost per bit of memory devices, 3D NAND (three-dimensional Not AND) memory devices have been developed. Other memory devices, such as ReRAM (resistive random access memory), and advanced hardmask materials are also being developed to further facilitate advances in the semiconductor industry.

Metal films, which may be used in memory devices, hardmasks, and the like, present several challenges to successful integration thereof into advanced device structures. Metal films are susceptible to spontaneous oxidation in ambient conditions, and the formation of a native oxide layer upon exposure thereof to ambient or even trace levels of oxygen, increases the resistivity of such metal films by orders of magnitude. Pure metal films may also exhibit very high tensile stress and rough surface morphology, depending on the method of formation thereof, which can lead to deleterious non-uniformities within the device structures formed using such metal films.

Thus, what is needed in the art are improved methods and materials for fabricating semiconductor devices. More specifically, what is needed are highly conductive metal and metal derived films with tunable stress characteristics and smooth morphologies.

SUMMARY

In one embodiment, a substrate processing method is provided. The method includes depositing a metal containing film on a substrate, depositing a metal derived film on the metal containing film, and repeating the sequential deposition of a metal containing film and a metal derived film on the metal containing film in an alternating manner to form a film stack. The film stack exhibits a resistivity of less than about 80 $\mu\Omega$/cm, a stress of between about 0 MPa and about 500 MPa, and a surface roughness of less than about RMS=0.6 nm.

In another embodiment, a substrate processing method is provided. The method includes (a) depositing a first metal containing film on a substrate, (b) performing a modification process on the first metal containing film to form a first metal derived film, (c) depositing a second metal containing film similar to the first metal containing film on the first metal derived film, and (d) performing the modification process on the second metal containing film to form a second metal derived film on the first metal derived film. Operations (a)-(d) are repeated to form a film stack which includes the first and second metal derived films. The film stack exhibits a resistivity of less than about 80 $\mu\Omega$/cm, a stress of between about 0 MPa and about 500 MPa, and a surface roughness of less than about RMS=0.6 nm.

In yet another embodiment, a substrate processing method is provided. The method includes forming a metal material layer on a substrate. The metal material layer includes a plurality of metal containing films and a plurality of metal derived films arranged in a stacked and alternating arrangement. An oxide material layer is formed on the metal material layer and the metal material layer and the oxide material layer are etched to form a channel trench. A polysilicon material is deposited on sidewalls of the channel trench and an oxide material is deposited in the channel trench.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods and materials for fabricating semiconductor device structures. In one example, a metal film stack includes a plurality of metal containing films and a plurality of metal derived films arranged in an alternating manner. In another example, a metal film stack includes a plurality of metal containing films which are modified into metal derived films. The metal film stacks exhibit improved characteristics, such as reduced resistivity, reduced stress, and smooth morphologies. In certain embodiments, the metal film stacks are used in oxide/metal/oxide/metal (OMOM) structures for memory devices.

Figure 1A:
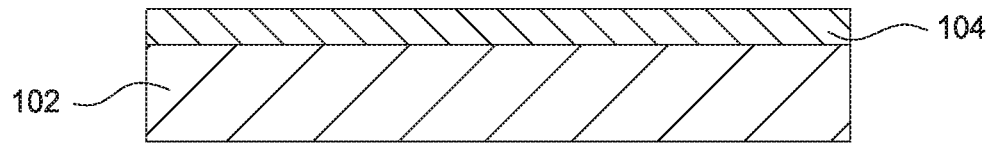
FIG. 1A illustrates a cross-section of a substrate having a first film formed thereon according to an embodiment described herein.

FIG. 1A illustrates a cross-section of a substrate 102 having a first film 104 formed thereon according to an embodiment described herein. In one embodiment, the substrate 102 is a silicon containing substrate. In another embodiment, the substrate 102 is an oxide material layer. For example, the substrate 102 is an oxide material layer which is part of an oxide/metal/oxide/metal (OMOM) film stack utilized in a memory device structure.

The first film 104 is deposited on and contacts the substrate 102. In one embodiment, the first film 104 is a metal containing film. For example, the first film 104 may be a pure metal material or a metal material having various other non-metal components therein. Examples of metal materials suitable for utilization as the first film 104 include, but are not limited to, titanium, tantalum, tungsten, cobalt, copper, ruthenium, rhenium, alloys, combinations, and mixtures thereof.

In another example, the first film 104 contains a combination of metal material and non-metal material. Examples of metal/non-metal materials suitable for utilization as the first film 104 include, but are not limited to, titanium nitride materials, tantalum nitride materials, tungsten nitride materials, cobalt nitride materials, copper nitride materials, ruthenium nitride materials, and rhenium nitride materials, among others. Additional examples of metal/non-metal materials suitable for utilization as the first film 104 include, but are not limited to, titanium carbide materials, tantalum carbide materials, tungsten carbide materials, cobalt carbide materials, copper carbide materials, ruthenium carbide materials, and rhenium carbide materials, among others.

The first film 104 is deposited by a deposition process, such as a chemical vapor deposition (CVD) process, a plasma enhanced chemical vapor deposition (PECVD) process, or a thermal CVD process, depending upon desired implementation characteristics. One example of a suitable deposition chamber for performing said deposition process is the PRODUCER® PRECISION™ processing apparatus available from Applied Materials, Inc., Santa Clara, Calif. It is contemplated that other suitable apparatus from other manufacturers may also be advantageously implemented in accordance with the embodiments described herein. In one embodiment, a plasma generated by the deposition chamber is a capacitively coupled plasma. In other embodiments, the plasma generated by the deposition chamber is an inductively coupled plasma or a plasma generated by a remote plasma source.

In one embodiment, a titanium material is deposited on the substrate 102 utilizing a PECVD process with a titanium containing precursor, such as Tetrakis(dimethylamino)titanium (TDMAT) or $TiCl_4$. In another embodiment, a tungsten material is deposited on the substrate 102 utilizing a PECVD process with a tungsten containing precursor, such as tungsten hexafluoride ($WF_6$), tungsten chloride materials ($WCl_x$), or tungsten hexacarbonyl ($W(CO)_6$) materials, among others. In another embodiment, a tantalum material is deposited on the substrate 102 utilizing a PECVD process with a tantalum containing precursor, such as a tantalum chloride material or a tantalum fluoride material.

The first film 104 is deposited in a PECVD chamber environment which is maintained at a temperature of between about 300° C. and about 600° C., such as between about 525° C. and about 575° C., and at a pressure of between about 2 Torr and about 20 Torr, such as between about 4 Torr and about 10 Torr. A high frequency RF current is applied to a gas distribution plate or showerhead at a power of between about 100 Watts and about 2,000 Watts, such as between about 1,000 Watts and about 1,400 Watts, to form a plasma from the titanium containing precursor which is delivered to the chamber environment at a flow rate of between about 100 standard cubic centimeters per minute (sccm) and about 2,000 sccm, such as between about 1,300 sccm and about 1,700 sccm.

Argon and hydrogen gas are additionally delivered to the chamber environment with the titanium precursor. In one embodiment, the argon is delivered with a flow rate of between about 1,000 sccm and about 10,000 sccm, such as between about 3,000 sccm and about 6,000 sccm, and the hydrogen is delivered with a flow rate of between about 1,000 sccm and about 10,000 sccm, such as between about 3,000 sccm and about 6,000 sccm.

Figure 1B:
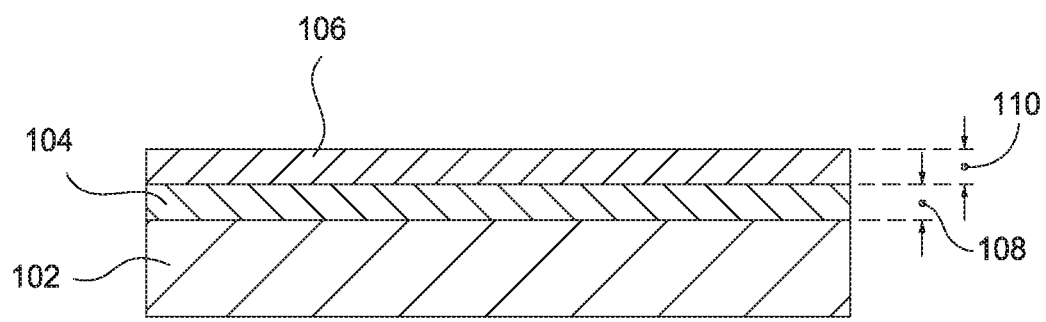
FIG. 1B illustrates a cross-section of the substrate of FIG. 1A having a second film formed thereon according to an embodiment described herein.

FIG. 1B illustrates a cross-section of the substrate 102 of FIG. 1A having a second film 106 formed thereon according to an embodiment described herein. The second film 106 is deposited on and contacts the first film 104. In one embodiment, the second film 106 is a metal derived film. As utilized herein, a metal derived film is a film which contains a metal material component and a non-metal material component. For example, a metal derived film is a nitride or carbide of the metal utilized to form the first film 104, such as titanium nitride, titanium carbide, tungsten nitride, tungsten carbide, etc. In an alternative embodiment, both of the first film 104 and the second film 106 are metal derived materials.

The second film 106 is deposited using a deposition process similar to the deposition process utilized to form the first film 104. In one embodiment, the second film 106 is deposited utilizing a PECVD process. The metal precursor utilized for deposition of the first film 104 is also utilized for forming the second film 106. In one embodiment, a nitrogen containing precursor is provided to the chamber environment along with the metal precursor. In this embodiment, the nitrogen precursor, such as a mixture of $N_2/H_2$, is delivered to the chamber environment at a flow rate of between about 1,000 sccm and about 10,000 sccm, such as between about 3,000 sccm and about 6,000 sccm. In another embodiment, a carbon containing precursor, for example, a hydrocarbon material such as $C_3H_6$, is delivered to the chamber environment at a flow rate of between about 1,000 sccm and about 10,000 sccm, such as between about 3,000 sccm and about 6,000 sccm.

In another embodiment, the second film 106 is deposited using a non-plasma process. In this embodiment, the metal precursor utilized for deposition of the first film 104 is also utilized for forming the second film 106. A nitrogen containing precursor is provided to the chamber environment along with the metal precursor. In this embodiment, the nitrogen precursor, such as NH₃, is delivered to the chamber environment at a flow rate of between about 1,000 sccm and about 10,000 sccm, such as between about 3,000 sccm and about 6,000 sccm.

Argon, and optionally hydrogen gas, are additionally delivered to the chamber environment with the nitrogen or carbon containing precursor. In one embodiment, the argon is delivered with a flow rate of between about 1,000 sccm and about 10,000 sccm, such as between about 3,000 sccm and about 6,000 sccm, and the hydrogen is delivered with a flow rate of between about 1,000 sccm and about 10,000 sccm, such as between about 3,000 sccm and about 6,000 sccm.

In one embodiment, the first film 104 is deposited to a thickness of less than about 10 Å, such as between about 2 Å and about 5 Å. Similarly, the second film 106 is deposited to a thickness of less than about 10 Å, such as between about 2 Å and about 5 Å.

Figure 1C:
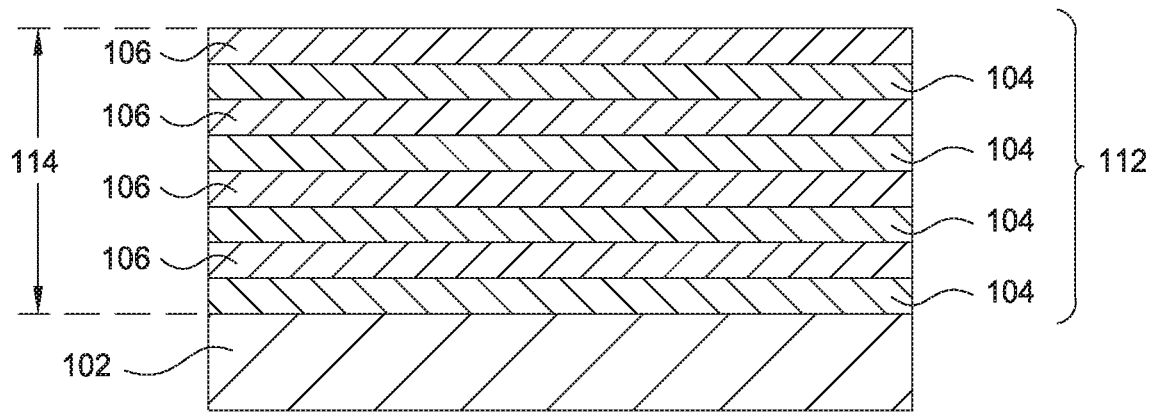
FIG. 1C illustrates a cross-section of the substrate of FIG. 1B having a film stack formed thereon according to an embodiment described herein.

FIG. 1C illustrates a cross-section of the substrate 102 of FIG. 1B having a film stack 112 formed thereon according to an embodiment described herein. The film stack 112 includes alternating layers of the first film 104 and the second film 106 disposed in a stacked arrangement. The cyclic deposition process utilized to form the alternating layers of the first film 104 and the second film 106 continuously delivers the metal containing precursor to the chamber environment to form the metal containing film (i.e. first film 104) and cycles the delivery of a nitrogen or carbon containing precursor on and off to form the metal derived film (i.e. second film 106) when the nitrogen or carbon containing precursor is being delivered, and form the pure metal material film or a metal material film having various other non-metal components therein (i.e., first film 104) when the nitrogen or carbon containing precursor is not being delivered. Advantageously, the first film 104 and second film 106 are formed without purging the chamber environment between the different film material depositions, thus improving throughput and increasing deposition efficiency of the deposition chamber. Alternatively, the chamber environment may be purged between deposition of the first film 104 and the second film 106.

The film stack 112, having a plurality of each of the first film 104 and the second film 106, has a thickness 114 of less than about 300 Å, such as between about 100 Å and about 200 Å, for example, about 150 Å. By utilizing the first film 104 and second film 106 to form a conductive device structure, resistivity and surface roughness characteristics of the film stack 112 may be improved. It is contemplated that both the resistivity and surface roughness characteristics are improved for individual layers (i.e. first film 104 and second film 106) as well as the entire film stack 112. For example, the film stack 112 may have a resistivity of less than about 80 µΩ/cm and a surface roughness of less than about root mean squared (RMS)=0.6 nm. In another example, each of the first film 104 and the second film 106 have a surface roughness of less than about root mean squared (RMS)=0.3 nm for 150 Å of thickness. Accordingly, reduced resistivity and improved film thickness uniformity may be achieved by utilizing the film stack 112 described herein.

As described above, is believed that by utilizing alternating metal containing layers and metal derived material layers with the thicknesses described herein, a more smooth film morphology may be achieved. It is also contemplated that by utilizing alternating metal containing layers and metal derived material layers, a stress of a film stack comprising the metal containing layers and metal derived material layers is tunable and may be made more compressive in nature than a pure metal film. For example, a stress of a film stack comprising the metal containing layers (tensile in nature) and metal derived material layers (compressive in nature) may have an overall stress measured at the film stack 112 between about 0 MPa and about 500 MPa, such as between about 50 MPa and about 250 MPa, which is believed to improve the film thickness uniformity of the film stack 212. Alternatively, the stress may be made compressive in nature, if desired, with a stress of the film stack 112 tuned to between about −500 MPa and about 0 MPa.

In addition, the second film 106, which is conductive in nature, may function as an encapsulating layer for the first film 104. For example, if the first film 104 is a pure metal material, the metal derived second film 106, which is deposited on the first film 104, covers, and thus prevents oxidation or formation of a native oxide layer on the first film 104. By preventing oxidation or formation of a native oxide layer on the first film 104, an increase in resistivity thereof is avoided, which improves device performance.

Figure 2A:
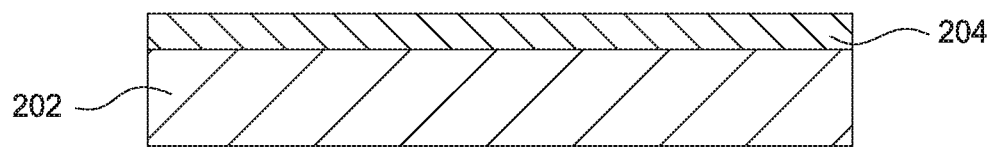
FIG. 2A illustrates a cross-section of a substrate having a first film formed thereon according to an embodiment described herein.

FIG. 2A illustrates a cross-section of a substrate 202 having a first film 204 formed thereon according to an embodiment described herein. In one embodiment, the substrate 202 is a silicon containing substrate. In another embodiment, the substrate 202 is an oxide material layer. For example, the substrate 202 is an oxide material layer which is part of an oxide/metal/oxide/metal (OMOM) film stack utilized in a memory device structure.

The first film 204 is deposited on and contacts the substrate 202. In one embodiment, the first film 204 is a metal containing film. For example, the first film 204 may be a pure metal material or a metal material having various other non-metal components therein. Examples of metal materials suitable for utilization as the first film 204 include, but are not limited to, titanium, tantalum, tungsten, cobalt, copper, ruthenium, rhenium, alloys, combinations, and mixtures thereof.

In another example, the first film 204 contains a combination of metal material and non-metal material. Examples of metal/non-metal materials suitable for utilization as the first film 204 include, but are not limited to, titanium nitride materials, tantalum nitride materials, tungsten nitride materials, cobalt nitride materials, copper nitride materials, ruthenium nitride materials, and rhenium nitride materials, among others. Additional examples of metal/non-metal materials suitable for utilization as the first film 204 include, but are not limited to, titanium carbide materials, tantalum carbide materials, tungsten carbide materials, cobalt carbide materials, copper carbide materials, ruthenium carbide materials, and rhenium carbide materials, among others.

In one example, the first film 204 is a metal containing material, such as a pure metal material. The first film 204 may be deposited with process parameters similar to those utilized to deposit the first film 104.

Figure 2B:
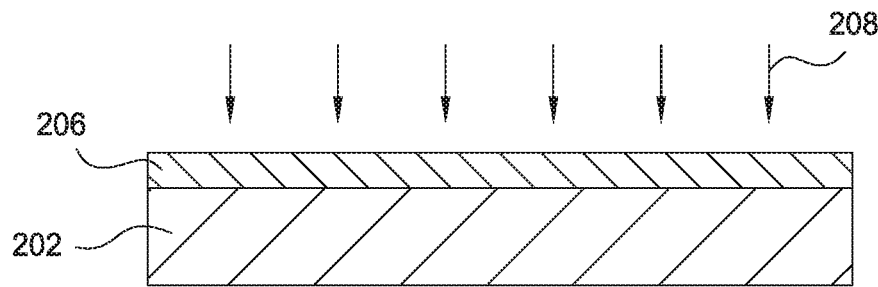
FIG. 2B illustrates a cross-section of the substrate of FIG. 2A after a modification process according to an embodiment described herein.

FIG. 2B illustrates a cross-section of the substrate 202 of FIG. 2A after a modification process according to an embodiment described herein. The first film 204 is subjected to a modification process to alter the material composition of the first film 204. In one example, the first film 204 is exposed to a plasma 208 to alter the composition of the first film 204. In implementations where there first film 204 is a pure metal material, the plasma 208 contains nitrogen and/or carbon to modify the first film 204 into a second film 206. The second film 206 may be either a nitride or carbide of the first film 204.

The modification process forms the plasma 208 from a nitrogen containing precursor which is provided to the chamber environment. In this embodiment, the metal precursor used to form the first film 204 is cycled off such that no metal is deposited during the modification process. In this embodiment, the nitrogen precursor, such as $NH_3$ or a mixture of $N_2/H_2$, is delivered to the chamber environment at a flow rate of between about 1,000 sccm and about 10,000 sccm, such as between about 3,000 sccm and about 6,000 sccm. In another embodiment, a carbon containing precursor, for example, a hydrocarbon material such as $C_3H_6$, is delivered to the chamber environment at a flow rate of between about 1,000 sccm and about 10,000 sccm, such as between about 3,000 sccm and about 6,000 sccm.

Argon and hydrogen gas are additionally delivered to the chamber environment with the nitrogen or carbon containing precursor. In one embodiment, the argon is delivered with a flow rate of between about 1,000 sccm and about 10,000 sccm, such as between about 3,000 sccm and about 6,000 sccm, and the hydrogen is delivered with a flow rate of between about 1,000 sccm and about 10,000 sccm, such as between about 3,000 sccm and about 6,000 sccm.

In various examples, the second film 206, after exposure to a nitrogen containing plasma 208, may be comprised of titanium nitride materials, tantalum nitride materials, tungsten nitride materials, cobalt nitride materials, copper nitride materials, ruthenium nitride materials, and rhenium nitride materials, among others. In another example, the second film 206, after exposure to a carbon containing plasma 208, may be comprised of titanium carbide materials, tantalum carbide materials, tungsten carbide materials, cobalt carbide materials, copper carbide materials, ruthenium carbide materials, and rhenium carbide materials, among others.

Figure 2C:
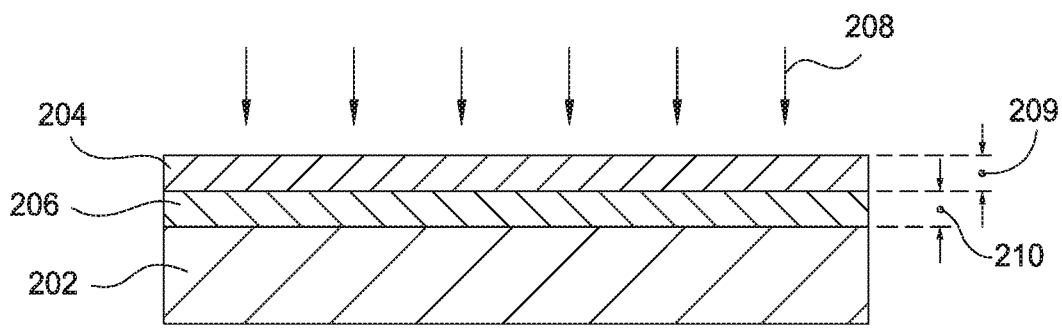
FIG. 2C illustrates a cross section of the substrate of FIG. 2B having a second film formed on the modified first film according to an embodiment described herein.

FIG. 2C illustrates a cross section of the substrate 202 of FIG. 2B having an additional first film 204 formed on the second film 206 (post modification of the first film 204) according to an embodiment described herein. An additional first film 204 of a pure metal material is formed on the second film 206 after modification of the initial first film 204 which altered the composition of the initial first film 204 into the second film 206. After the additional first film 204 is deposited on the second film 206, the additional first film 204 is modified by the plasma 208 in a process similar to the process described above which changed the composition of the initial first film 204 in to the second film 206.

In one embodiment, the first films 204 (initial first film 204 and any additional first film 204) are deposited to a thickness of less than about 10 Å, such as between about 2 Å and about 5 Å. The second film 206, after modification by the plasma 208 has a thickness of less than about 10 Å, such as between about 2 Å and about 5 Å. Thus, a thickness of the first film 204 after modification to the second film 206 remains the same or substantially the same.

Figure 2D:
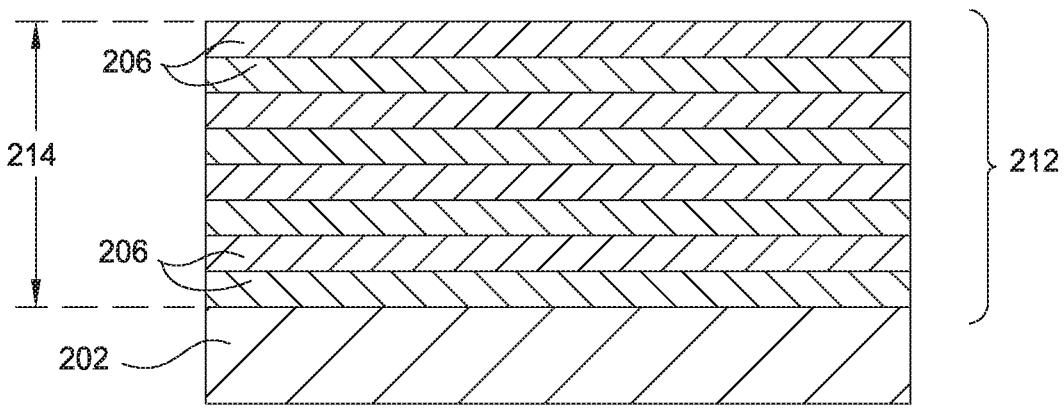
FIG. 2D illustrates a cross section of the substrate of FIG. 2C having a film stack formed thereon according to an embodiment described herein.

FIG. 2D illustrates a cross section of the substrate 202 of FIG. 2C having a film stack 212 formed thereon according to an embodiment described herein. The film stack 212 includes multiple layers of the second film 206 disposed in a stacked arrangement. The deposition process utilized to form the layers of the first film 204 and the second film 206 via the modification process, respectively, cycles a metal containing precursor to the chamber environment to form the metal containing film (i.e. first film 204) and subsequently cycles off the metal containing precursor and on the nitrogen or carbon containing precursor to form a metal derived film (i.e. second film 206). Advantageously, purging the chamber environment between the first film deposition process and the plasma modification process can be avoided, thus, improving throughput and increasing deposition efficiency. Alternatively, the chamber environment may be purged between deposition of the first film 204 and formation of the second film 206 via the plasma modification process.

The film stack 212, having a plurality of layers of the second film 206, has a thickness 214 of less than about 300 Å, such as between about 100 Å and about 200 Å, for example, about 150 Å. By utilizing the second film 206, which is formed from metal derived materials that are conductive in nature, resistivity and surface roughness characteristics of the film stack 212 may be improved. For example, the film stack 212 may have a resistivity of less than about 80 μΩ/cm and a surface roughness of less than about root mean squared (RMS)=0.6 nm. Accordingly, reduced resistivity and improved film thickness uniformity may be achieved by utilizing the film stack 212 described herein.

As described above, is believed that by utilizing metal derived material layers with the thicknesses described herein, a more smooth film morphology may be achieved. It is also contemplated that by utilizing metal derived material layers formed by the plasma modification process, a stress of the film stack 212 comprising the metal derived material layers is tunable and may be made more compressive in nature than a pure metal film. For example, a stress of a film stack comprising the metal derived material layers (i.e. second film 206) may have a stress between about 0 MPa and about 500 MPa, such as between about 50 MPa and about 250 MPa, which is believed to improve the film thickness uniformity of the film stack 212.

In addition, the second film 206, which is less susceptible to oxidation when compared to a pure metal film, is believed to prevent or substantially reduce oxidation or formation of a native oxide layer of the layers of second film 206 within the film stack 212. By preventing oxidation or formation of native oxide layers, an increase in resistivity is avoided, which improves device performance.

Figure 3A:
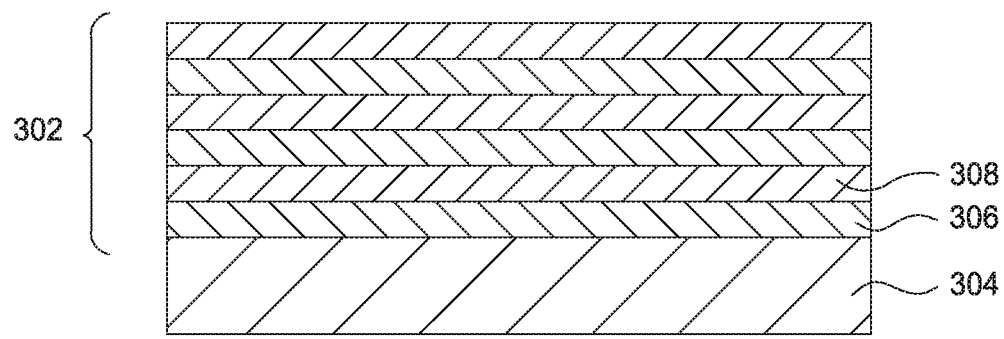
FIG. 3A illustrates a cross-section of a substrate having a film stack formed thereon according to an embodiment described herein.

FIG. 3A illustrates a cross-section of a substrate 304 having a film stack 302 formed thereon according to an embodiment described herein. The substrate 304 is a silicon containing substrate which may be utilized to form a memory device, for example, a 3D NAND memory device, an MRAM device, an ReRAM device, or the like thereon and therein. The film stack 302 is an OMOM layer stack. In one embodiment, a first layer 306 is disposed on and in contact with the substrate 304. In this embodiment, the first layer 306 is a metal containing material. In one implementation, the first layer 306 is the film stack 112. In another implementation, the first layer 306 is the film stack 212.

A second layer 308 is disposed on, and in contact with, the first layer 306. The second layer 308 is an oxide containing material, such as a semiconductor oxide, for example, a silicon oxide material, a germanium oxide material, or the like. The first layer 306 and the second layer 308 are disposed on the substrate 304 in a stacked and alternating arrangement.

Figure 3B:
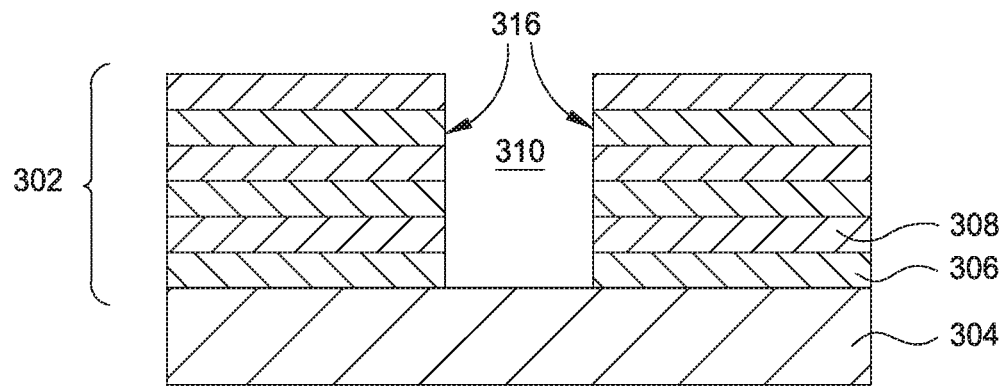
FIG. 3B illustrates a cross-section of the substrate of FIG. 3A after an etching process according to an embodiment described herein.

FIG. 3B illustrates a cross-section of the substrate 304 of FIG. 3A after an etching process according to an embodiment described herein. The film stack 302 is patterned and etched to form a channel trench 310 which is defined by sidewalls 316 of the film stack 302. A mask used for patterning, in one example, is a carbon based film or a doped carbon film, such as a tungsten doped carbon film, a tungsten and boron doped carbon film, or a boron doped carbon film. Alternatively, the mask used for patterning, in another example, is a nitrogen containing film, such as a titanium nitride film, a titanium silicon nitride film, a tantalum nitride film, a tantalum silicon nitride film, or the like. In one embodiment, the etching process is an anisotropic etching process. The anisotropic etching process enables the sidewalls 316 of the film stack 302 to be substantially vertical in nature along a depth of the channel trench 310, which may have a depth of between about 100 nm and about 10 µm.

Figure 3C:
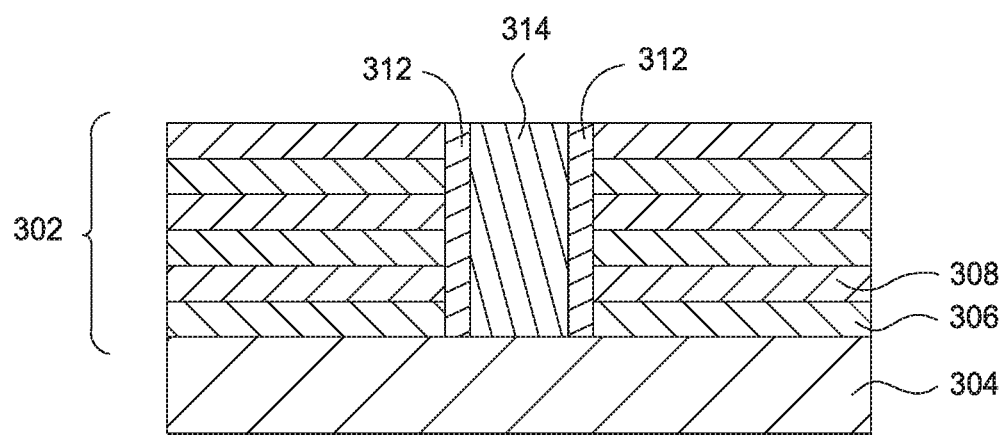
FIG. 3C illustrates a cross-section of the substrate of FIG. 3B after a channel fill process according to an embodiment described herein.

FIG. 3C illustrates a cross-section of the substrate 304 of FIG. 3B after a channel fill process according to an embodiment described herein. The channel trench 310 is filled with one or more channel materials. In one embodiment, a polysilicon channel material 312 is deposited on the sidewalls 316 of the channel trench 310, such as by a CVD process. Dimensions of the polysilicon channel material 312 may be similar to those of the channel trench 310. After deposition of the polysilicon channel material 312, a remainder of the channel trench 310 is filled with a channel hole material 314, for example, an oxide material or the like, for example silicon oxide, such as by a CVD process. In one embodiment, the material utilized for the channel hole material 314 is similar to the material utilized for the second layer 308.

Figure 4:
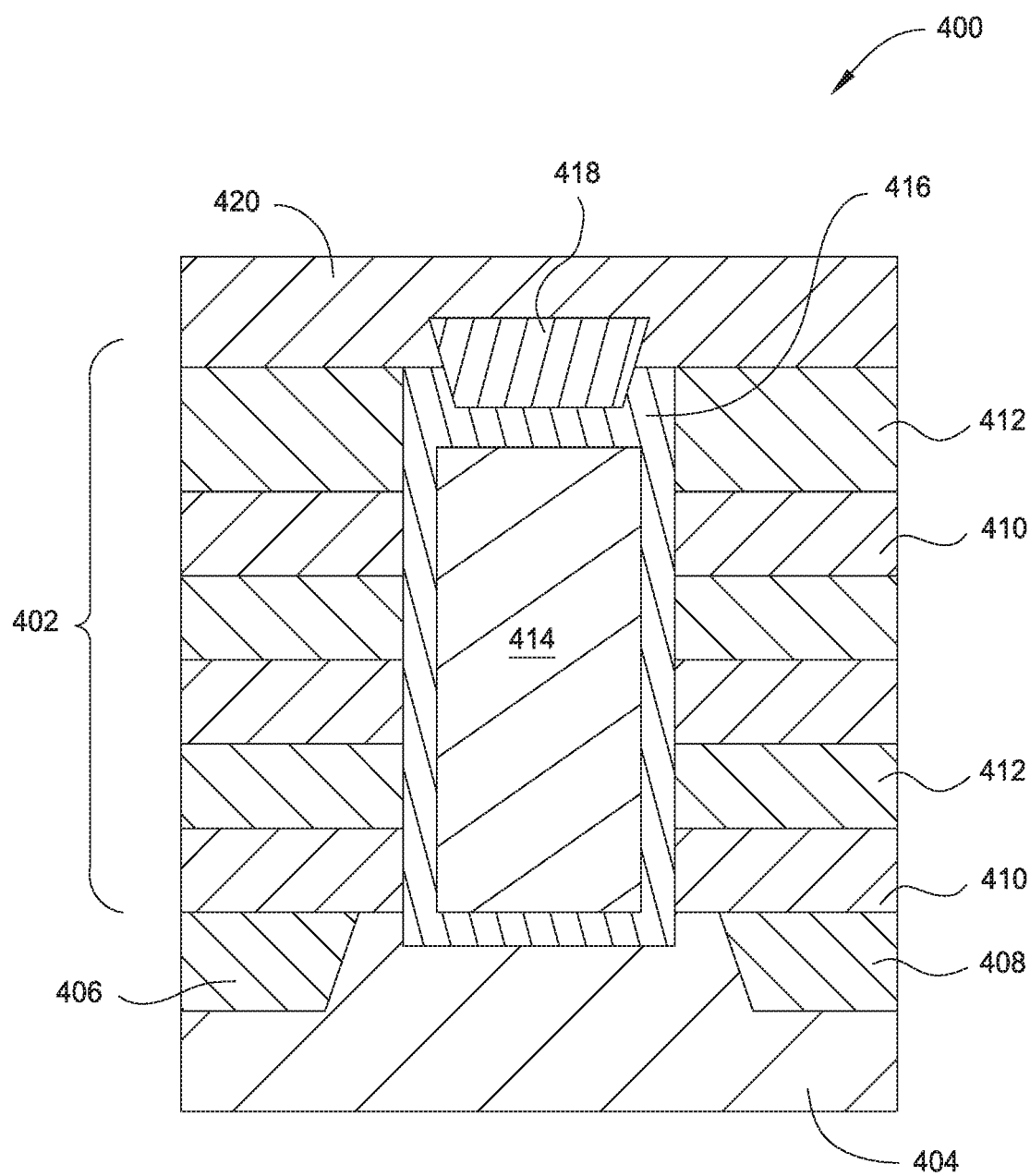
FIG. 4 illustrates a cross-section of a 3D NAND device structure according to an embodiment described herein.

FIG. 4 illustrates a cross-section of a 3D NAND device structure 400 according to an embodiment described herein. The device structure 400 includes a substrate 404, which may be a p-type silicon containing substrate, and a film stack 402 formed on the substrate 404. The substrate 404 also includes a source region 406 and a drain region 408. In one embodiment, the regions 406, 408 are n-type wells.

The film stack 402, which may be formed according to the process described with regard to FIGS. 3A-3C, includes a first layer 410 and a second layer 412 disposed in an alternating arrangement. The first layer 410 is a metal containing layer and the second layer 412 is an oxide material layer. In one example, the first layer 410 is formed from either of the film stacks 112/212 described with regard to FIGS. 1A-1C and 2A-2D, respectively. A polysilicon channel material 416 and a channel hole material 414 are formed similarly to the materials 312/314 described with regard to FIG. 3C. A plug structure 418 is disposed in contact with the polysilicon channel material 416 opposite the substrate 404. A line structure 420 is formed over the film stack 402 and the plug structure 418.

The device structure 400 described herein is illustrative in nature and not intended to be limiting, for other memory and semiconductor devices may benefit from the embodiments described herein. It is contemplated that the film stacks 112/212 may be utilized in the device structure 400 or other similar structures and may benefit from the various advantages associated with such film stacks. Accordingly, advanced OMOM film stacks with desirable resistivity, stress, and morphology characteristics may be achieved by implementation of the various embodiments and examples described herein.

While the foregoing is directed to embodiments of the present disclosure, other and further embodiments of the disclosure may be devised without departing from the basic scope thereof, and the scope thereof is determined by the claims that follow.

What is claimed is:

1. A substrate processing method, comprising:
   depositing a metal containing film on a substrate;
   depositing a metal derived film on the metal containing film;
   repeating sequential deposition of a metal containing film and a metal derived film on the metal containing film in an alternating manner to form a film stack of metal containing films and metal derived films, wherein the film stack exhibits a resistivity of less than about 80 µΩ/cm, a stress of between about 0 MPa and about 500 MPa, and a surface roughness of less than about RMS=0.6 nm.

2. The method of claim 1, wherein the metal containing film is selected from the group consisting of titanium, tantalum, tungsten, cobalt, copper, ruthenium, rhenium, alloys, combinations, and mixtures thereof.

3. The method of claim 2, wherein the metal containing film is titanium.

4. The method of claim 1, wherein the metal derived film is a nitride of the metal containing film.

5. The method of claim 4, wherein the metal derived film comprises titanium nitride.

6. The method of claim 1, wherein each of the metal containing film and the metal derived film in the film stack are deposited via a chemical vapor deposition process.

7. The method of claim 6, wherein the chemical vapor deposition process continually supplies a metal precursor and cycles on and off a nitrogen containing precursor to form the metal containing film and the metal derived film, respectively.

8. The method of claim 7, wherein the chemical vapor deposition process is performed in a process chamber without purging the process chamber between cycles of the nitrogen containing precursor.

9. The method of claim 1, wherein each metal containing film in the film stack has a thickness of less than about 10 Å.

10. The method of claim 7, wherein each metal derived film in the film stack has a thickness of less than about 10 Å.

11. A substrate processing method, comprising:
    (a) depositing a first metal containing film on a substrate;
    (b) performing a modification process on the first metal containing film to form a first metal derived film;
    (c) depositing a second metal containing film similar to the first metal containing film on the first metal derived film;
    (d) performing the modification process on the second metal containing film to form a second metal derived film on the first metal derived film;
    repeating (a)-(d) to form a film stack comprised of the first and second metal derived films, wherein the film stack exhibits a resistivity of less than about 80 µΩ/cm, a stress of between about 0 MPa and about 500 MPa, and a surface roughness of less than about RMS=0.6 nm.

12. The method of claim 11, wherein the first metal containing film and the second metal containing film are selected from the group consisting of titanium, tantalum, tungsten, cobalt, copper, ruthenium, rhenium, alloys, combinations, and mixtures thereof.

13. The method of claim 11, wherein the first metal derived film and the second metal derived film are nitrides of the first metal containing film and the second metal containing film, respectively.

14. The method of claim 13, wherein the modification process comprises exposing the first metal containing film and the second metal containing film to a nitrogen containing plasma.

15. The method of claim 11, wherein each of the first and second metal derived films in the film stack have a thickness of less than about 10 Å.

16. The method of claim 15, wherein a thickness of the film stack is between about 100 Å and about 300 Å.

17. A substrate processing method, comprising:
    forming a metal material layer on a substrate, wherein the metal material layer includes a plurality of metal containing films and a plurality of metal derived films arranged in a stacked and alternating manner;

forming an oxide material layer on the metal material layer;

etching the metal material layer and the oxide material layer to form a channel trench;

depositing a polysilicon material on sidewalls of the channel trench; and depositing an oxide material over the polysilicon in the channel trench.

18. The method of claim 17, wherein the plurality of metal containing films are selected from the group consisting of titanium, tantalum, tungsten, cobalt, copper, ruthenium, rhenium, alloys, combinations, and mixtures thereof.

19. The method of claim 18, wherein the plurality of metal derived films are a nitride of the plurality of metal containing films.

20. The method of claim 19, wherein the metal containing films are a titanium material and the plurality of metal derived films are a titanium nitride material.

* * * * *